(12) United States Patent
Leussler (10) Patent No.: US 9,341,689 B2
(45) Date of Patent: May 17, 2016

(54) DEVICES AND CABLING FOR USE IN A MULTI-RESONANT MAGNETIC RESONANCE SYSTEM

(75) Inventor: Christoph Leussler, Hamburg (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 1081 days.

(21) Appl. No.: 13/262,691

(22) PCT Filed: Apr. 1, 2010

(86) PCT No.: PCT/IB2010/051426
§ 371 (c)(1),
(2), (4) Date: Dec. 5, 2011

(87) PCT Pub. No.: WO2010/113133
PCT Pub. Date: Oct. 7, 2010

(65) Prior Publication Data
US 2012/0074944 A1 Mar. 29, 2012

(30) Foreign Application Priority Data

Apr. 2, 2009 (EP) .................................... 09157139

(51) Int. Cl.
*G01R 33/36* (2006.01)
*G01R 33/28* (2006.01)

(52) U.S. Cl.
CPC .............. *G01R 33/36* (2013.01); *G01R 33/288* (2013.01); *G01R 33/287* (2013.01); *G01R 33/3635* (2013.01); *G01R 33/3685* (2013.01)

(58) Field of Classification Search
USPC .......................... 324/300–322; 600/407–435; 382/128–131; 333/202, 205, 219.1, 333/235
See application file for complete search history.

(56) References Cited

U.S. PATENT DOCUMENTS

| | | | | | |
|---|---|---|---|---|---|
| 4,922,204 | A | * | 5/1990 | Duerr et al. | .................... 324/322 |
| 5,107,217 | A | | 4/1992 | Duerr | |
| 5,166,620 | A | * | 11/1992 | Panosh | .......................... 324/322 |
| 5,294,886 | A | | 3/1994 | Duerr | |
| 5,949,311 | A | * | 9/1999 | Weiss et al. | .................... 333/202 |
| 6,284,971 | B1 | | 9/2001 | Atalar et al. | |

(Continued)

FOREIGN PATENT DOCUMENTS

| | | |
|---|---|---|
| JP | 2009045425 A | 3/2009 |
| JP | 2010522020 A | 7/2010 |

(Continued)

OTHER PUBLICATIONS

Seeber et al, "Floating Radio Frequency Balun for Suppression of Shield Currents", Proceedings of the Interational Society for Magnetic Resonance in Medicine, vol. 11, Jul. 10, 2003, p. 2377.

(Continued)

*Primary Examiner* — Melissa Koval
*Assistant Examiner* — Tiffany Fetzner (57) ABSTRACT

An apparatus for use in a magnetic resonance system including an operative component configured to perform a useful operation in a magnetic resonance system; an electrical cable connected with the operative component to provide electrical communication with the operative component; and a resonant circuit including at least a portion of the electrical cable, the resonant circuit having a first impedance pole at a first magnetic resonance frequency and a second impedance pole at a second magnetic resonance frequency different from the first magnetic resonance frequency.

16 Claims, 5 Drawing Sheets

(56) References Cited

U.S. PATENT DOCUMENTS

| | | |
|---|---|---|
| 6,605,775 B1 | 8/2003 | Seeber et al. |
| 6,993,373 B2 | 1/2006 | Vrijheid et al. |
| 7,088,104 B2* | 8/2006 | Bottomley .................. 324/328 |
| 7,132,829 B2* | 11/2006 | Hudson et al. ............... 324/318 |
| 7,816,918 B2* | 10/2010 | Bottomley et al. ........... 324/318 |
| 8,004,281 B2* | 8/2011 | Bottomley et al. ........... 324/318 |
| 2001/0047132 A1* | 11/2001 | Johnson et al. ............. 600/410 |
| 2003/0094950 A1 | 5/2003 | Burl et al. |
| 2005/0062472 A1* | 3/2005 | Bottomley .................. 324/317 |
| 2005/0283167 A1 | 12/2005 | Gray |
| 2008/0033281 A1 | 2/2008 | Kroeckel |
| 2008/0262584 A1 | 10/2008 | Bottmley et al. |
| 2009/0015256 A1* | 1/2009 | Bottomley et al. ........... 324/309 |
| 2011/0037468 A1* | 2/2011 | Bottomley et al. ........... 324/313 |
| 2012/0074944 A1* | 3/2012 | Leussler .................... 324/322 |
| 2014/0300360 A1* | 10/2014 | Lin et al. .................... 324/318 |

FOREIGN PATENT DOCUMENTS

| | | |
|---|---|---|
| JP | 2010196140 A | 9/2010 |
| WO | 2007034341 A2 | 3/2007 |
| WO | 2007047966 A2 | 4/2007 |
| WO | 2008115383 A2 | 9/2008 |

OTHER PUBLICATIONS

Mispelter et al, "Multiple Frequencies Tuning", NMR Probeheads for Biophysical and Biomedical Experiments, Chapter 6, Imperial College Press, 2006, pp. 187-260.

* cited by examiner

DEVICES AND CABLING FOR USE IN A MULTI-RESONANT MAGNETIC RESONANCE SYSTEM

FIELD OF THE INVENTION

The following relates to the magnetic resonance arts, magnetic resonance imaging arts, magnetic resonance spectroscopy arts, medical magnetic resonance imaging and spectroscopy arts, and related arts.

BACKGROUND OF THE INVENTION

Magnetic resonance (MR) techniques for medical applications, such as functional MR imaging (fMRI), MR spectroscopy, quantitative MR imaging or mapping, and so forth can benefit from performing magnetic resonance excitation at multiple magnetic resonance frequencies. For example, multi-nuclear imaging of one or more non-$^1$H resonances, such as $^{31}$P nuclear magnetic resonance, $^{19}$F nuclear magnetic resonance, $^{13}$C nuclear magnetic resonance, $^{23}$Na nuclear magnetic resonance, $^{17}$O nuclear magnetic resonance, or so forth can elicit chemical distribution mapping from which metabolic and biological functional information can be inferred.

Existing MR systems are generally configured for imaging of the $^1$H nuclear magnetic resonance. Components such as radio frequency receive coils, catheters or other interventional instruments designed for use in interventional procedures monitored by MR imaging, or so forth are designed to be safe and reliable under radio frequency excitation of $^1$H nuclear magnetic resonance. For example, components which include electrically conductive parts or are connected with electrical cabling are designed to suppress natural resonance coinciding with the $^1$H nuclear magnetic resonance. These devices may, however, be unsafe for multinuclear magnetic resonance applications.

SUMMARY OF THE INVENTION

In accordance with certain illustrative embodiments shown and described as examples herein, an apparatus is disclosed for use in a magnetic resonance system, the apparatus comprising: an operative component configured to perform a useful operation in a magnetic resonance system; an electrical cable connected with the operative component to provide electrical communication with the operative component; and a resonant circuit including at least a portion of the electrical cable, the resonant circuit having a first impedance pole at a first magnetic resonance frequency and a second impedance pole at a second magnetic resonance frequency different from the first magnetic resonance frequency.

In accordance with certain illustrative embodiments shown and described as examples herein, a magnetic resonance system is disclosed, comprising a magnetic resonance scanner and an apparatus as set forth in the immediately preceding paragraph.

One advantage resides in providing safe and reliable components for use in multi-resonance MR applications.

Another advantage resides in facilitating multi-nuclear magnetic resonance imaging, spectroscopy, and so forth.

Further advantages will be appreciated by those of ordinary skill in the art upon reading and understanding the following detailed description.

BRIEF DESCRIPTION OF THE DRAWINGS

The drawings are only for purposes of illustrating the preferred embodiments, and are not to be construed as limiting the invention. Corresponding reference numerals when used in the various figures represent corresponding elements in the figures.

DETAILED DESCRIPTION OF EMBODIMENTS

Figure 1:
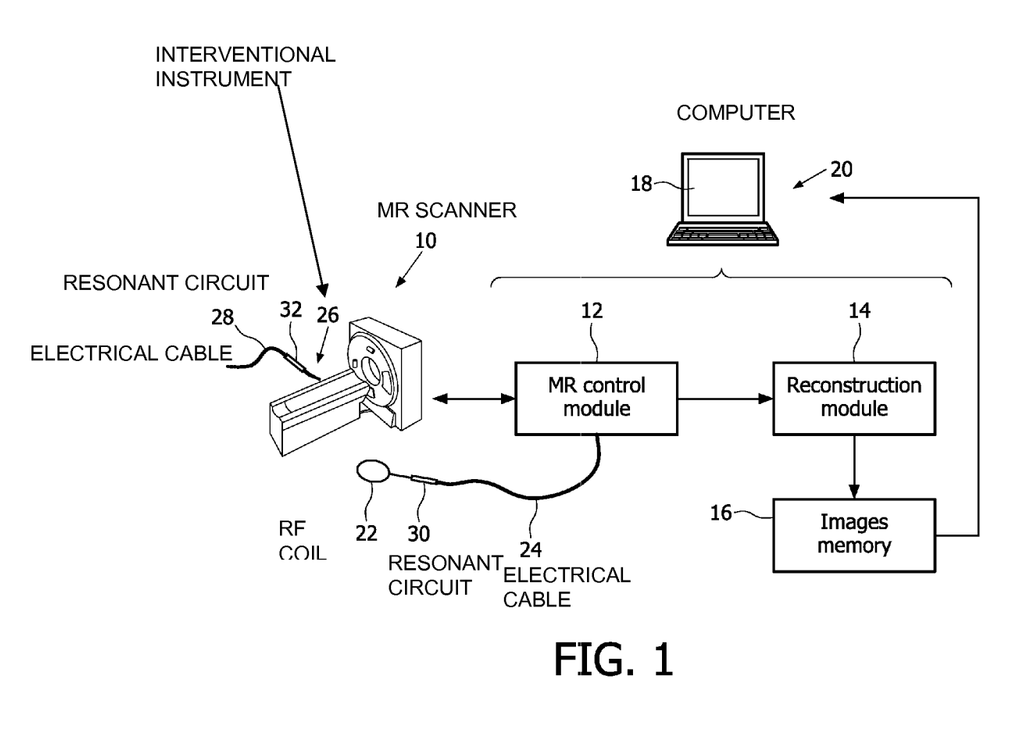
FIG. 1 diagrammatically shows a magnetic resonance system.

With reference to FIG. 1, an imaging system includes a magnetic resonance (MR) scanner 10, such as an illustrated Achieva™ magnetic resonance scanner (available from Koninklijke Philips Electronics N.V., Eindhoven, The Netherlands), or an Intera™ or Panorama™ magnetic resonance scanner (both also available from Koninklijke Philips Electronics N.V.), or another commercially available magnetic resonance scanner, or a non-commercial magnetic resonance scanner, or so forth. In a typical embodiment, the magnetic resonance scanner includes internal components (not illustrated) such as a superconducting or resistive main magnet generating a static ($B_0$) magnetic field, sets of magnetic field gradient coil windings for superimposing selected magnetic field gradients on the static magnetic field, and so forth. The MR scanner 10 is controlled by an MR control module 12 to excite and spatially encode magnetic resonance data that is reconstructed by a reconstruction module 14 to generate one or more magnetic resonance images of a subject disposed in the field of view (FOV) of the MR scanner 10. The reconstructed images are suitably stored in an images memory 16, displayed on a display 18 of a computer 20, or otherwise utilized. In spectroscopic applications, spectroscopic characteristics of the acquired magnetic resonance data (optionally again including spatial encoding) are extracted to obtain chemical information or other information about the subject. In the illustrated embodiment, the processing and memory components 12, 14, 16 are embodied by a digital processor and memory (not shown) of the illustrated computer 20. In other embodiments, these components may be variously embodied by one or more dedicated digital or ASIC controllers or data processing components.

The magnetic resonance system includes a radio frequency system for exciting magnetic resonance at one or more selected magnetic resonance frequencies and for detecting the excited magnetic resonance signals. The illustrated system includes a representative loop-type local radio frequency coil 22 that is connected with the MR control module 12 by an electrical cable 24, which is typically a coaxial or triaxial cable to provide radio frequency shielding. The electrical cable 24 provides electrical communication with the radio frequency coil 22, such as by providing at least one of a radio frequency power conductor and a radio frequency signal conductor. The illustrated loop-type coil 22 is representative, and it is to be understood that the radio frequency system can include radio frequency coils of various configurations, such as birdcage coils, transverse electromagnetic (TEM) coils, or so forth, and can include radio frequency coils of various sizes and anatomical conformations, such as whole-body coils, head coils, limb coils, or so forth. Further, it is to be understood that the coils may include transmit-only coils, receive-only coils, and transmit/receive (T/R) coils, or various combinations thereof. In some embodiments, a single coil may be used for both transmit and receive operations, while in some other embodiments a whole-body coil may be used as the transmitter and an array of multiple receive coils (e.g., four, eight, twelve, sixteen, or more receive coils) may be used to receive the magnetic resonance, while in some other embodiments an array of multiple transmit/receive (T/R) coils (e.g., four, eight, twelve, sixteen, or more T/R coils) may be used for both transmit and receive operations. In the case of a coil array, the illustrated electrical cable 24 includes a plurality of electrical cables connecting with the multiple radio frequency coils of the array. It is also to be understood that the representative radio frequency coil 22 is illustrated located outside of the bore of the MR scanner 10 (and hence outside of the MR FOV) for illustrative convenience—in operation, the radio frequency coil 22 is disposed in the bore of the MR scanner 10, such movement of the coil 22 being enabled by flexibility of the electrical cable 24. In some types of radio frequency coils, such as a whole body coil permanently or semi-permanently mounted in the bore of the MR scanner 10, the connecting electrical cable may be more rigid.

The representative radio frequency coil 22 with the illustrated electrical cable 24 for providing electrical communication with the coil 22 is a representative example of an operative component configured to perform a useful operation in the magnetic resonance system. Depending upon the magnetic resonance application, other operative components may be provided which are configured to perform useful operations in the magnetic resonance system. As a representative example, the illustrated embodiment further includes an interventional instrument 26, such as a catheter, biopsy needle, or so forth. An electrical cable 28 is connected with the interventional instrument 26 to provide electrical communication with the interventional instrument 26. For example, the electrical cable 28 may be a power conductor, a signal conductor, or so forth. In FIG. 1, only a portion of the electrical cable 28 that is proximate to the interventional instrument 26 is illustrated—it is to be understood that the distal end of the electrical cable 28 connects with a suitable power source, signal processing device, or so forth.

The magnetic resonance system of FIG. 1 can be used as a multi-resonance magnetic resonance system. That is, the magnetic resonance system of FIG. 1 is configurable to excite and receive magnetic resonance at two or more different magnetic resonance frequencies, such as at the $^1$H magnetic resonance frequency and at a second magnetic resonance frequency selected from the group consisting of $^{31}$P nuclear magnetic resonance, $^{19}$F nuclear magnetic resonance, $^{13}$C nuclear magnetic resonance, $^{23}$Na nuclear magnetic resonance, and $^{17}$O nuclear magnetic resonance. More generally, the magnetic resonance system of FIG. 1 is configurable to excite and receive magnetic resonance at different magnetic resonance frequencies including a first magnetic resonance frequency and a second magnetic resonance different from the first magnetic resonance frequency. During the excitation phase of a magnetic resonance data acquisition, the radio frequency system injects radio frequency energy at the magnetic resonance frequency or frequencies, which is typically represented in the art as a transmit "$B_1$" field. The excitation $B_1$ field can, in general, induce electric current at the magnetic resonance frequency or frequencies in electrically conductive components within the $B_1$ excitation field. Electrically conductive components within the $B_1$ excitation field include the illustrated representative operative components 22, 26 that are configured to perform useful operations in the magnetic resonance system, and the electrical cables 24, 28 connected with the respective operative components 22, 26 to provide electrical communication with the respective operative components 22, 26.

With continuing reference to FIG. 1, a resonant circuit 30 includes at least a portion of the electrical cable 24. The resonant circuit 30 has a first impedance pole at a first magnetic resonance frequency that is excited by the MR system and has a second impedance pole at a second magnetic resonance frequency excited by the MR system that is different from the first magnetic resonance frequency. For example, if the MR system is configured to excite magnetic resonance at both the $^1$H and $^{13}$C nuclear magnetic resonance frequencies, then the resonant circuit 30 suitably has impedance poles at both the $^1$H and $^{13}$C nuclear magnetic resonance frequencies. The phrase "first impedance pole at a first magnetic resonance frequency" means that the resonant circuit 30 presents a high impedance to electrical current at the first magnetic resonance frequency. Similarly, the phrase "second impedance pole at a second magnetic resonance frequency" means that the resonant circuit 30 presents a high impedance to electrical current at the second magnetic resonance frequency.

In similar fashion, a resonant circuit 32 includes at least a portion of the electrical cable 28. The resonant circuit 32 has a first impedance pole at the first magnetic resonance frequency that is excited by the MR system and has a second impedance pole at the second magnetic resonance frequency excited by the MR system. By including the resonant circuits 30, 32, the excitation $B_1$ field at the first and/or second magnetic resonance frequency does not induce substantial electric current at the magnetic resonance frequency in the cables 24, 28. Rather, flow of such induced electric current is substantially blocked by the high impedance presented by the first and second impedance poles of the resonant circuits 30, 32. In this way, operative components 22, 26 and respective electrical cables 24, 28 are made safe for use in the multi-nuclear MR system of FIG. 1.

With reference to FIGS. 2-13, some illustrative resonant circuits suitable for use as the resonant circuits 30, 32 are described.

Figure 2:
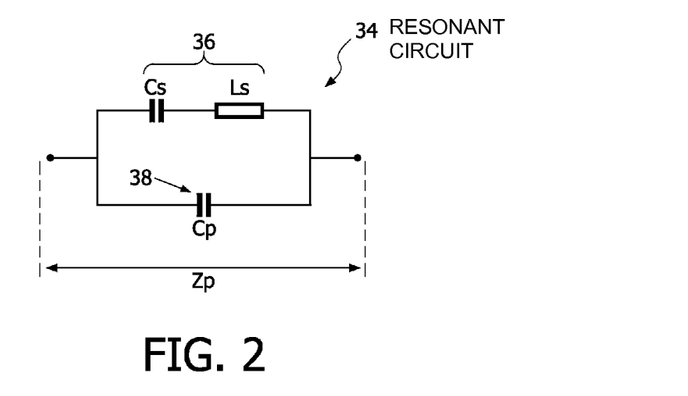
FIGS. 2-13 illustrate various resonant circuit embodiments that are suitable for use as the resonant circuits shown in FIG. 1.

FIG. 2 shows a resonant circuit 34 in which an impedance 36 formed by a series combination of an inductance $L_s$ and a capacitance $C_s$ is placed in parallel with an impedance 38 formed by a capacitance $C_p$. The elements $L_s$, $C_s$, and $C_p$ are shown as discrete or lumped elements, but can also be embodied as distributed elements. The total impedance across the series-parallel resonant circuit 34 of FIG. 2 is denoted as $Z_p$, which can be shown to have the form:

$$Z_p(\omega) = \frac{(\omega_p^2 - \omega_s^2)(\omega^2 - \omega_s^2)}{(\omega^2 - \omega_p^2)} * \frac{L_s}{\omega} \tag{1}$$

where $\omega = 2\pi f$ is the frequency in radians corresponding to frequency f in Hertz and the parameters $\omega_p$ and $\omega_s$ are determined by the impedances $L_s$, $C_s$, and $C_p$. The resonant circuit 34 has an impedance pole at $\omega_p$ and an impedance zero at $\omega_s$.

Figure 3:
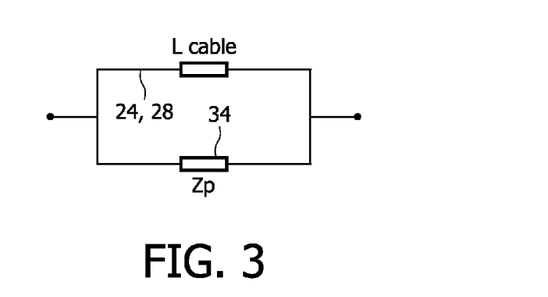

FIG. 3 shows the resonant circuit 34 of FIG. 2 placed in parallel with a portion of the electrical cable 24 or the electrical cable 28 having inductive impedance $L_{cable}$. That is, the portion of an electrical cable having impedance $L_{cable}$ is a portion of the electrical cable 24 or a portion of the electrical cable 28 of FIG. 1. The resonant circuit of FIG. 3 is defined by the resonant circuit 34 and the electrical cable portion having inductance $L_{cable}$, and is a suitable embodiment for either of the resonant circuits 30, 32 diagrammatically shown in FIG. 1. The resonant circuit of FIG. 3 is resonant when $L_{cable}$ is equal to $Z_p*$ where $Z_p*$ is the complex conjugate of the impedance $Z_p$ of the resonant circuit 34. Therefore, by tuning the impedances $L_s$, $C_s$, and $C_p$ to select the impedance pole $\omega_p$ and impedance zero $\omega_s$ of the impedance $Z_p$, the resonant circuit of FIG. 3 can be tuned to provide impedance poles at two different magnetic resonance frequencies. Denoting the two different magnetic resonance frequencies as $\omega_1$, $\omega_2$ where $\omega_1 \neq \omega_2$, the tuned impedances are given by:

$$C_s = \frac{(\omega_s^2 - \omega_1^2)(\omega_2^2 - \omega_s^2)}{\omega_s^2 * \omega_1^2 * \omega_2^2} * \frac{1}{L_{cable}} \quad (2)$$

$$C_p = \frac{\omega_s^2}{\omega_1^2 * \omega_2^2} * \frac{1}{L_{cable}} \quad (3)$$

and $$L_s = \frac{1}{C_s * \omega_s^2} \quad (4)$$

Typically, the electrical cable inductance $L_{cable}$ is in a range 300-600 nH. The component values $L_s$, $C_s$, $C_p$ for the resonant circuit of FIG. 3 can be calculated using Equations (2)-(4). For practical implementations, the inductance $L_s$ is typically around 50-300 nH and the capacitances $C_s$, $C_p$ are typically in a range around 5-100 pF. For values in these ranges, small tolerance lumped inductors and capacitors are generally available.

The lumped elements $L_s$, $C_s$, $C_p$ can be replaced by or mixed with distributed elements, for example embodied as transmission lines (not shown). For example, a quarter-wavelength transmission line terminated by an open connection, which provides zero impedance at the resonance frequency, can be used in place of the series resonant circuit 36 formed by the series combination of $L_s$, $C_s$. Such an arrangement can be convenient, for example, in the interventional instrument 26 where a transmission line can be conveniently integrated into the lumen of an elongated catheter or other elongate interventional instrument.

At resonance, high RF currents may flow in the resonant circuits 30, 32; accordingly, the impedance elements $L_s$, $C_s$, $C_p$ (or operatively equivalent distributed elements such as transmission lines) should be selected to have low losses and high RF current handling.

Figure 4:
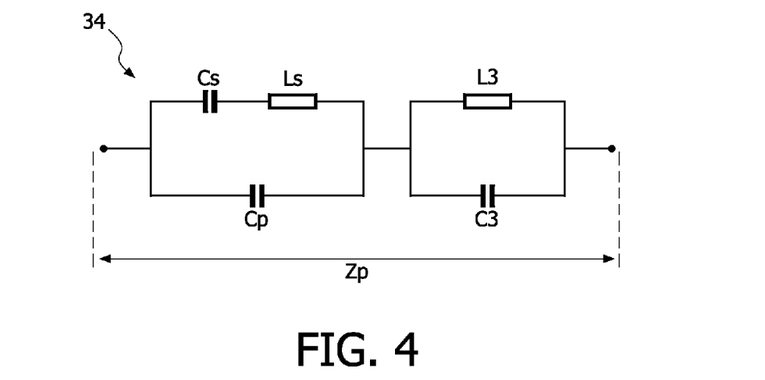

With reference to FIG. 4, if the number of magnetic resonance frequencies to be trapped is greater than two, a triply-resonant circuit can be used. In the illustrative example of FIG. 4, the resonant circuit 34 of FIG. 2 is placed in series with a parallel resonant circuit including a parallel combination of inductance $L_3$ and capacitance $C_3$. The resonant circuit of FIG. 4 is suitably connected in parallel to the electrical cable portion of inductance $L_{cable}$, and the further parameters $L_3$, $C_3$ tuned according to the resonance condition:

$$\omega_3 \equiv \frac{1}{\sqrt{L_3 C_3}} \quad (5)$$

Figure 5:
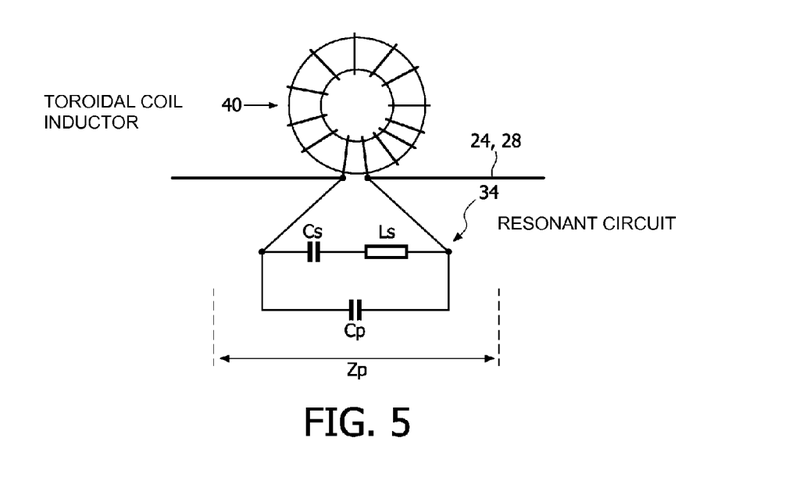

With reference to FIG. 5, another suitable resonant circuit embodiment is disclosed, which includes a toroidal coil inductor 40 defining the electrical cable portion impedance $L_{cable}$. The toroidal coil inductor is connected in parallel across the circuit 34 of FIG. 2 having a low impedance zero at lower frequency and a high impedance pole at higher frequency. Thus the cable has a high impedance point at the location of the toroidal coil inductor 40 at two frequencies. An advantage of the arrangement of FIG. 5 is that the toroidal coil inductor 40 can be constructed to define the inductance $L_{cable}$ with high precision. The toroidal coil inductor 40 can be embodied as a physical coil wrapped around a ferromagnetic or air core as shown, or can be embodied as a stripline coil formed on a printed circuit board (see FIG. 6). The electrical cable 24 or electrical cable 28 is suitably a semirigid coaxial cable in which the outer shield is connected to the circuit shown in FIG. 5.

Figure 6:
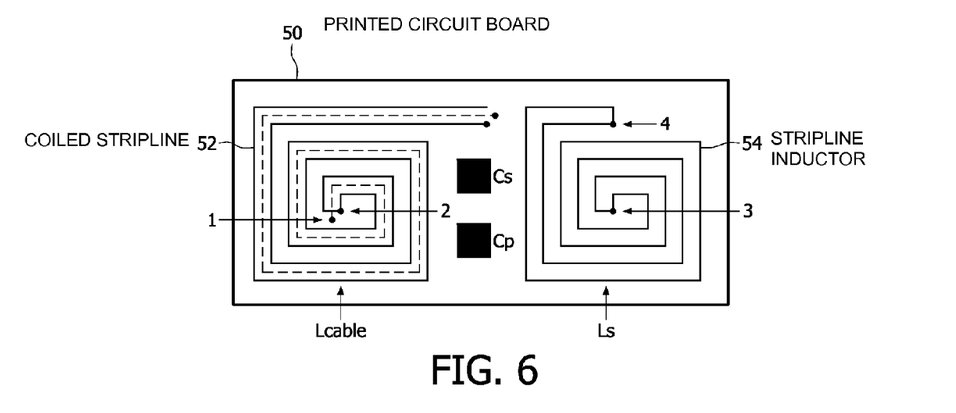

FIG. 6 shows a physical implementation of the resonant circuit of FIG. 3 in which the inductors $L_s$, $L_{cable}$ are implemented as striplines on a printed circuit board 50 and the capacitors $C_p$, $C_s$ are also formed on the printed circuit board. In the stripline double resonant circuit shown in FIG. 6, the coaxial cable is connected at points (1, 2) so that a coiled stripline 52 defines part of the electrical cable having inductance $L_{cable}$, while the contact terminals for a stripline inductor 54 defining the inductance $L_s$, are at points (3,4). Connection of the components is performed by a different layer of the printed circuit board (not shown). The circuit of FIG. 6 is implemented as a multi-stripline layout, with a ground plane (not shown).

Figure 7:
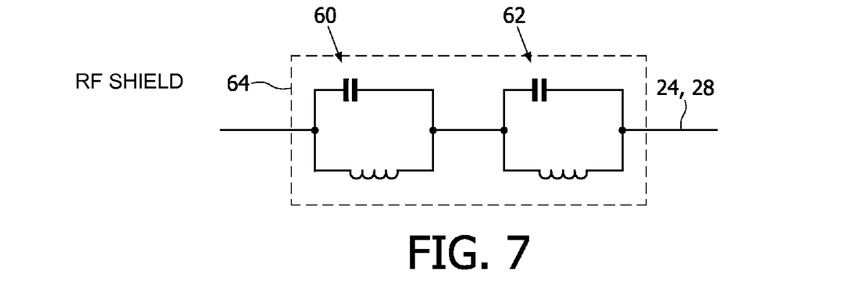

FIG. 7 shows an embodiment of the resonant circuit in which the electrical cable 24 or the electrical cable 28 electrically connects in series (i) a first resonant circuit 60 that is resonant at the first magnetic resonance frequency and (ii) a second resonant circuit 62 that is resonant at the second magnetic resonance frequency. The illustrative first and second resonant circuits 60, 62 are parallel LC resonant circuits having resonance frequencies of the form set forth in Equation (5), but other resonant circuit topologies are also contemplated. Although not illustrated, it will be appreciated that three or more resonant circuits can optionally be electrically connected in series analogous to the configuration shown in FIG. 7 to trap three or more different magnetic resonance frequencies.

The illustrative resonant circuit of FIG. 7, including the portion of the electrical cable 24, 28 that is included as part of the resonant circuit, is enclosed in a radio frequency shield 64 which advantageously suppresses emission of radio frequency interference (RFI) from the resonant circuit and isolates the resonant circuit from outside RFI. Although not illustrated in all of the representative resonant circuits shown herein, it is to be appreciated that the radio frequency shield 64 is optionally included with any of the illustrated representative resonant circuits shown herein.

Figure 8:
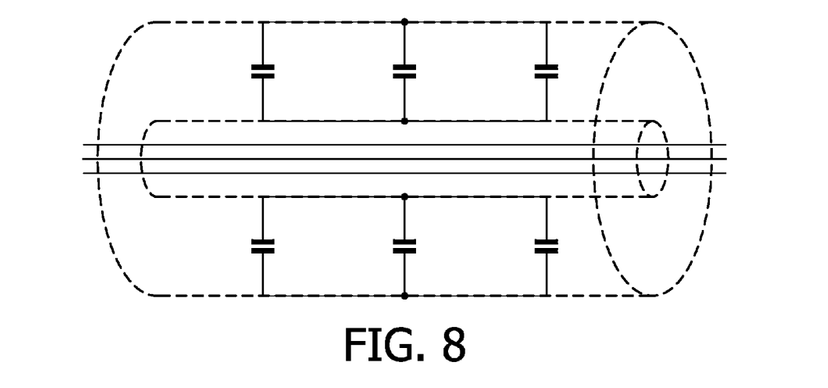

FIG. 8 diagrammatically shows a resonant circuit including an electrically conductive cylindrical element 70 arranged coaxially around the electrical cable 24 or the electrical cable 28 and having outer and inner coaxial cylindrical walls 72, 74 spaced apart by a gap containing or defining distributed or lumped capacitance. The coaxial trap device embodied by the cylindrical element 70 inductively coupled with the electrical cable 24 or the electrical cable 28 can be configured to have two resonances corresponding to first and second different magnetic resonance frequencies by adjusting the capacitances using lumped capacitor elements, by adjusting geometrical dimensions of the element 70 such as the spacings of the walls 72, 74 from each other and from the electrical cable 24 or the electrical cable 28.

Figure 9:
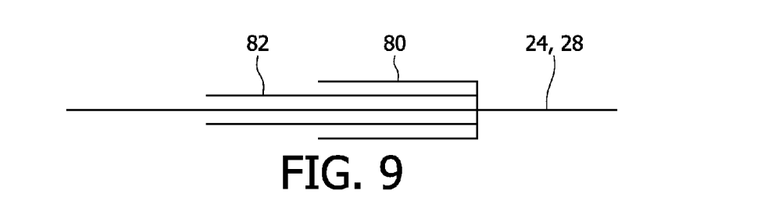
Figure 10:
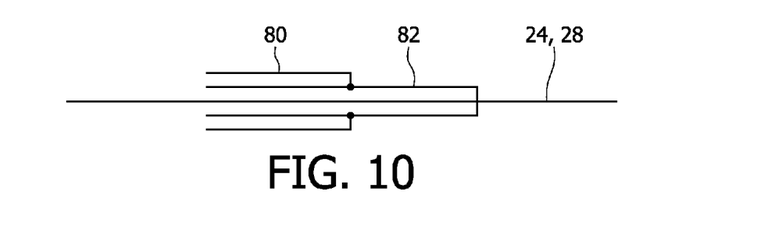
Figure 11:
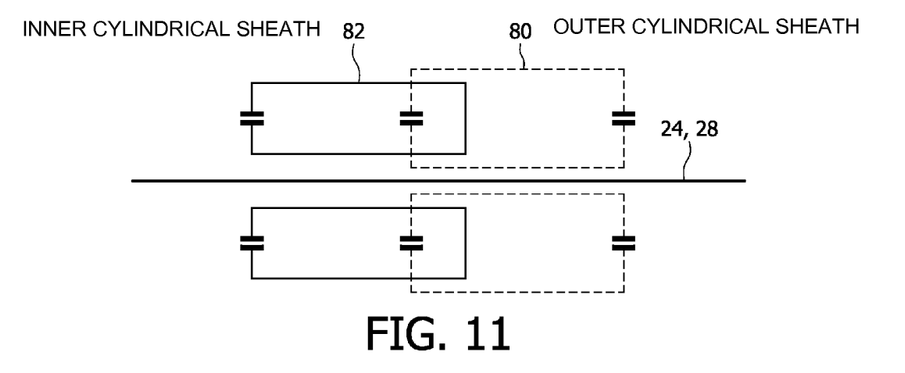
Figure 12:
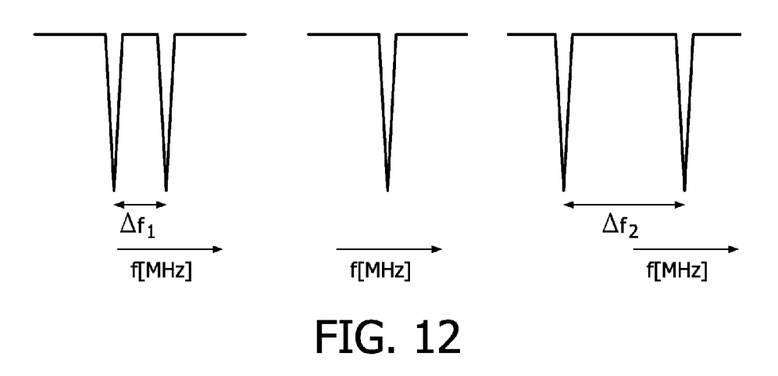

With reference to FIGS. 9-12, a resonant circuit embodied as a bazooka-type trap is illustrated. The bazooka trap includes outer and inner electrically conductive cylindrical sheaths 80, 82 arranged coaxially respective to each other and respective to the electrical cable 24 or the electrical cable 28. As shown in FIGS. 9 and 10, one end of the outer cylindrical sheath 80 is electrically connected with the inner cylindrical sheath 82, and the relative positions of the two sheaths 80, 82 are adjustable along the coaxial axis. FIG. 11 shows an electrical model of the bazooka trap of FIGS. 9 and 10. FIG. 12 illustrates the impact of axial adjustment of the relative positions of the two sheaths 80, 82 on the resonance frequencies of the bazooka traps. Conceptually, the operation can be understood as follows. Each sheath has a resonance frequency, so that the bazooka trap has two resonance frequencies. However, mutual coupling between the two conductive cylindrical sheaths 80, 82 and between the sheaths and the electrical cable 24 or the electrical cable 28 affects the values of the two resonance frequencies. Accordingly, as shown in FIG. 12 by adjusting the axial overlap between the two sheaths 80, 82 the two resonance frequencies can be adjusted until they coincide with desired first and second different magnetic resonance frequencies. In FIG. 12, the left and right plots show the resonance frequencies for "double-tuned" configurations, while in the center plot of FIG. 12 the overlap is adjusted so that the two frequencies are the same.

Figure 13:
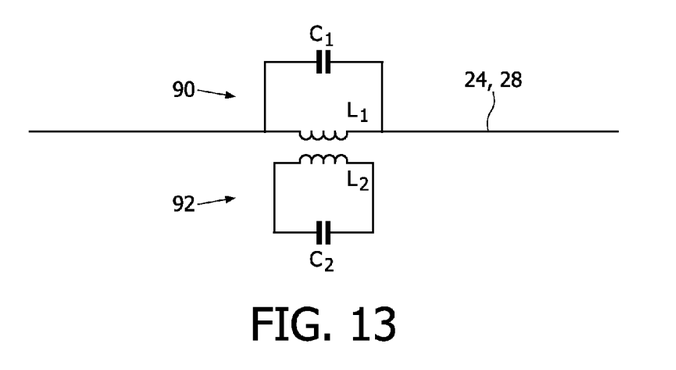

FIG. 13 shows a resonant circuit including: (i) a conductively coupled resonant circuit 90 including a cable inductance $L_1$ (corresponding to $L_{cable}$ in some other drawings) across which is placed a parallel capacitor $C_1$; and (ii) an inductively coupled resonant circuit 92 including a parallel LC circuit formed by a parallel interconnection of inductance $L_2$ and capacitance $C_2$. The trap has two resonances:

$$\omega_1 \equiv \frac{1}{\sqrt{L_1 C_1}} \quad (6)$$

generated by the conductively coupled resonant circuit 90, and $$\omega_2 \equiv \frac{1}{\sqrt{L_2 C_2}} \quad (7)$$

generated by the inductively coupled resonant circuit 92. The values of the inductances $L_1$ and $L_2$ are affected by the mutual inductance or "transformer action" between the individual inductances $L_1$ and $L_2$, thus providing another degree of freedom for tuning the doubly-resonant circuit. In some suitable physical implementations, the inductances $L_1$ and $L_2$ can be formed by wrapping around a common ferromagnetic core as in a physical transformer configuration.

The resonant circuits illustrated by FIGS. 2-13 are merely representative examples, and it is to be understood that other doubly-resonant circuits (or triply-resonant circuits, or more generally N-resonant circuits where N is greater than or equal to two and corresponds to the number of different magnetic resonance frequencies to be trapped) can be used to embody the representative resonant circuits 30, 32 shown in FIG. 1.

The invention has been described with reference to the preferred embodiments. Modifications and alterations may occur to others upon reading and understanding the preceding detailed description. It is intended that the invention be construed as including all such modifications and alterations insofar as they come within the scope of the appended claims or the equivalents thereof. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The disclosed method can be implemented by means of hardware comprising several distinct elements, and by means of a suitably programmed computer. In the system claims enumerating several means, several of these means can be embodied by one and the same item of computer readable software or hardware. The mere fact that certain measures are recited in mutually different dependent claims does not indicate that a combination of these measures cannot be used to advantage.

Having thus described the preferred embodiments, the invention is now claimed to be:

1. An apparatus configured for use with a magnetic resonance scanner having a field of view configured for a subject, the magnetic resonance scanner controlled by a magnetic resonance controller in order to excite and detect magnetic resonance signals at different frequencies, the apparatus comprising:
    an operative component that is selected from one of an interventional instrument, a radio frequency coil and an electrically conductive component configured to operate in the field of view of the magnetic resonance scanner;
    a cable including a conductive element, wherein the cable is arranged in order to provide electrical communication between the magnetic resonance controller and the operative component; and
    a resonant circuit comprising:
        at least a portion of the conductive element of the cable; and
        one or more passive electrical components connected in parallel to the portion of the conductive element of the cable,
        wherein the resonant circuit is configured to provide both a first impedance pole at a first magnetic resonance frequency and a second impedance pole at a second magnetic resonance frequency different from the first magnetic resonance frequency when the operative component enters the field of view of the magnetic resonance scanner; and
    thereby providing both the first impedance pole at the first magnetic resonance frequency and the second impedance pole at the different second magnetic resonance frequency when the magnetic resonance scanner is operated.

2. The apparatus as set forth in claim 1, wherein the first magnetic resonance frequency is the 1H magnetic resonance frequency and the second magnetic resonance frequency is a frequency that is different from the 1H magnetic resonance frequency.

3. The apparatus as set forth in claim 1, wherein the second magnetic resonance frequency is selected from the group consisting of:
    31 P nuclear magnetic resonance, 19F nuclear magnetic resonance, 13C nuclear magnetic resonance, 23Na nuclear magnetic resonance, and 17O nuclear magnetic resonance, as the second magnetic resonance frequency.

4. The apparatus as set forth in claim 1,
    wherein the operative component includes an interventional instrument; and
    the electrical cable is one of:
        a power conductor; and
        a signal conductor.

5. The apparatus as set forth in claim 1,
    wherein the operative component includes a radio frequency coil; and
    the electrical cable is at least one of:
        a radio frequency power conductor; and
        a radio frequency signal conductor.

6. The apparatus as set forth in claim 1,
    wherein the resonant circuit includes a toroidal coil inductor that is connected in parallel with the one or more passive electrical components.

7. The apparatus as set forth in claim 1, further comprising:
    a radio frequency shield surrounding the resonant circuit.

8. The apparatus as set forth in claim 1, wherein the resonant circuit comprises:
a first impedance pole that is resonant at the first magnetic resonance frequency; and
a second impedance pole that is resonant at the second magnetic resonance frequency,
wherein the cable connects the first impedance pole and the second impedance pole in series with one another.

9. The apparatus as set forth in claim 1,
wherein the resonant circuit is a first resonant circuit and the apparatus further comprises a second resonant circuit that is inductively coupled with the electrical cable and is also inductively coupled with the first resonant circuit.

10. The apparatus as set forth in claim 1, wherein the resonant circuit further comprises:
a first impedance including a series combination of an inductance and a capacitance; and
a second impedance including a capacitance both connected in parallel across at least the portion of the conductive element of the cable,
wherein the resonant circuit is also arranged to have the first impedance pole at the first magnetic resonance frequency and to have the second impedance pole at the second magnetic resonance frequency that is different from the first magnetic resonance frequency.

11. The apparatus as set forth in claim 1, wherein the resonant circuit comprises:
a cylinder with two surfaces, an inner conductive surface and an outer conductive surface, each of the surfaces being inductively coupled with the cable that is lying substantially at the axis of the cylinder; and
whereby the first and second magnetic resonance frequencies are determined by at least one or more physical dimensions of the cylinder and a least one capacitance connected between the inner and outer conductive surfaces.

12. The apparatus as set forth in claim 1, wherein the resonant circuit comprises:
at least first and second coaxial cylinders that are substantially coaxial with the cable lying substantially along their common axis;
the first coaxial cylinder inductively coupled with the cable;
the second coaxial cylinder inductively coupled with the cable and electrically connected to the first coaxial cylinder; and
wherein the relative position of the first coaxial cylinder relative to the second coaxial cylinder defines the resonant circuit.

13. The apparatus as set forth in claim 1, wherein the resonant circuit, is a distributed resonant circuit extending along a length, of the cable.

14. The apparatus as set forth in claim 1, wherein the resonant circuit comprises:
at least one stripline component that is inductively or conductively connected with the cable.

15. A magnetic resonance system comprising:
a magnetic resonance scanner having a field of view configured for a subject;
a magnetic resonance controller arranged in order to control the magnetic resonance scanner and in order to excite and detect magnetic resonance signals at different frequencies; and
an apparatus comprising:
an operative that is selected from one of an interventional instrument, a radio frequency coil and an electrically conductive component configured to operate in the field of view of the magnetic resonance scanner;
a cable comprising a conductive element wherein the cable is arranged in order to provide electrical communication between the magnetic resonance controller and the operative component; and
a resonant circuit including at least a portion of the conductive element of the cable and one or more passive electrical components connected in parallel to the portion, of the conductive element of the cable, wherein the resonant circuit is configured to provide both a first impedance pole at a first magnetic resonance frequency and a second impedance pole at a second magnetic resonance frequency different from the first magnetic resonance frequency, when the operative component enters the field of view of the magnetic resonance scanner;
thereby providing both the first impedance pole at the first magnetic resonance frequency and the second impedance pole at the different second magnetic resonance frequency, when the magnetic resonance scanner is operated.

16. A magnetic resonance system comprising:
a magnetic resonance scanner having a field of view configured for a subject;
a magnetic resonance controller arranged in order to control the magnetic resonance scanner and in order to excite and detect magnetic resonance signals at different frequencies;
an operative component that is selected from one of an interventional instrument, a radio frequency coil and an electrically conductive component configured to operate in the field of view of the magnetic resonance scanner;
a cable including a conductive element, wherein the cable is arranged in order to provide electrical communication between the magnetic resonance controller and the operative component; and
a first resonant circuit including
at least a portion of the conductive element of the cable and one or more passive electrical components connected in parallel to the portion of the conductive element of the cable, wherein the first resonant circuit is configured to excite and receive both a first impedance pole at a first magnetic resonance frequency and a second impedance pole at a second magnetic resonance frequency that is different from the first magnetic resonance frequency, when the operative component enters the field of view of the magnetic resonance scanner;
thereby providing both the first impedance pole at the first magnetic resonance frequency and the second impedance pole at the different second magnetic resonance frequency, when the magnetic resonance scanner is operated,
wherein the first resonant circuit further comprises
a second resonant circuit that is inductively coupled with the electrical cable, and
a third resonant circuit including the portion of the conductive element of the cable.

* * * * *